US012566381B2

(12) United States Patent
Lubomirsky et al.

(10) Patent No.: US 12,566,381 B2
(45) Date of Patent: Mar. 3, 2026

(54) CHAMBER AND METHODS OF COOLING A SUBSTRATE AFTER BAKING

(71) Applicant: Applied Materials, Inc., Santa Clara, CA (US)

(72) Inventors: Dmitry Lubomirsky, Cupertino, CA (US); Douglas A. Buchberger, Jr., Livermore, CA (US); Hyunjun Kim, Campbell, CA (US); Alan L. Tso, San Jose, CA (US); Shekhar Athani, Bangalore (IN); Qiwei Liang, Fremont, CA (US); Ellie Y. Yieh, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 666 days.

(21) Appl. No.: 17/960,798

(22) Filed: Oct. 5, 2022

(65) Prior Publication Data

US 2023/0161260 A1     May 25, 2023

Related U.S. Application Data

(60) Provisional application No. 63/264,548, filed on Nov. 24, 2021.

(51) Int. Cl.
| | |
|---|---|
| *G03F 7/20* | (2006.01) |
| *G03F 7/16* | (2006.01) |
| *H01L 21/67* | (2006.01) |

(52) U.S. Cl.
CPC ............ *G03F 7/2041* (2013.01); *G03F 7/168* (2013.01); *H01L 21/67109* (2013.01); *H01L 21/67115* (2013.01)

(58) Field of Classification Search
CPC ............... H01L 23/26; H01L 21/67103; H01L 21/67248; H01L 21/67748; H01L 21/68742; C23C 14/541
See application file for complete search history.

(56) References Cited

U.S. PATENT DOCUMENTS

| | | |
|---|---|---|
| 2003/0203295 A1 | 10/2003 | Kim et al. |
| 2016/0035601 A1 | 2/2016 | Eum et al. |

(Continued)

FOREIGN PATENT DOCUMENTS

| | | | |
|---|---|---|---|
| CN | 105810612 A | | 7/2016 |
| JP | 2007234980 A | * | 9/2007 |

(Continued)

OTHER PUBLICATIONS

International Search Report and Written Opinion Application No. PCT/US2022/045938, Dated Feb. 2, 2023.

(Continued)

*Primary Examiner* — Gregory A Wilson
(74) *Attorney, Agent, or Firm* — Patterson + Sheridan, LLP

(57) ABSTRACT

A method and apparatus for performing post-exposure bake cooling operations is described herein. The method begins by post exposure baking a substrate disposed on heated substrate support in a process chamber, the process chamber having a showerhead. The heated substrate support is moved to increase a distance between the heated substrate support and a cooled plate of the showerhead. The substrate is separated from the heated substrate support using a substrate lifting device. The substrate is moved into a close proximity to the cooled showerhead. The substrate is cooled until the substrate is less than about 70 degrees Celsius. The substrate is spaced away from the cooled showerhead using the substrate lifting device and aligning the substrate with a substrate transfer passage of the processing chamber for removal by a robot.

20 Claims, 7 Drawing Sheets

(56)     References Cited

U.S. PATENT DOCUMENTS

| | | | | |
|---|---|---|---|---|
| 2018/0204757 A1 * | 7/2018 | Fushimi | ............ | H01J 37/32568 |
| 2021/0381101 A1 * | 12/2021 | Nanjundappa | ...... | H01L 21/6719 |
| 2022/0308462 A1 * | 9/2022 | Berney | .................. | G03F 7/167 |

FOREIGN PATENT DOCUMENTS

| | | | | | |
|---|---|---|---|---|---|
| JP | 2008-16768 | A | | 1/2008 | |
| JP | 2019-21806 | A | | 2/2019 | |
| KR | 10-2009-0124590 | A | | 12/2009 | |
| KR | 20190009701 | A | | 1/2019 | |
| KR | 20190082709 | A | * | 7/2019 | |
| WO | 2006069256 | A2 | | 6/2006 | |
| WO | WO-2021202171 | A1 | * | 10/2021 | ......... H01L 21/2636 |

OTHER PUBLICATIONS

Japanese Office Action for Application No. 2024-530532 dated Mar. 27, 2025.
Japanese Office Action for Application No. 2024-530532 dated Jul. 22, 2025.
Korean Office Action for Application No. 10-2024-7020279 dated Jun. 11, 2025.

* cited by examiner

400

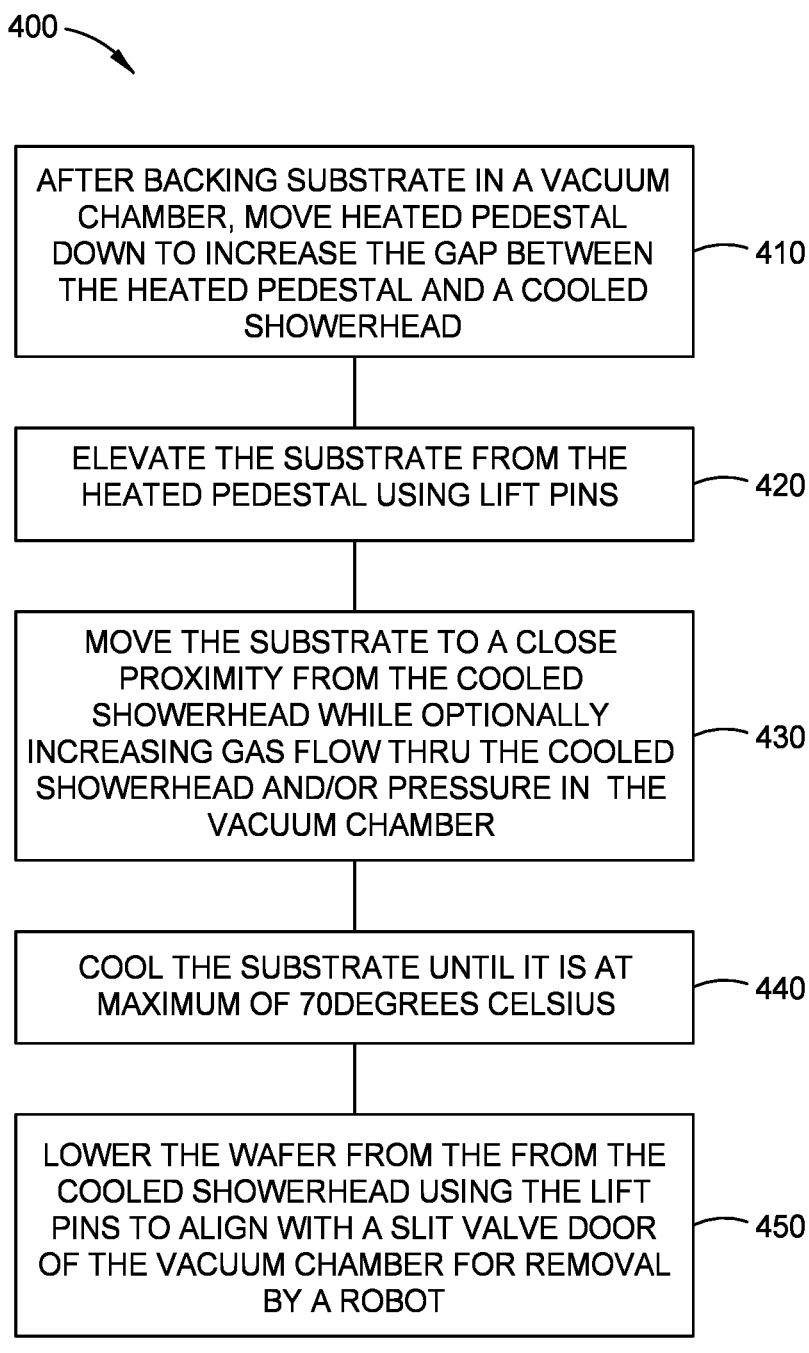

AFTER BACKING SUBSTRATE IN A VACUUM CHAMBER, MOVE HEATED PEDESTAL DOWN TO INCREASE THE GAP BETWEEN THE HEATED PEDESTAL AND A COOLED SHOWERHEAD — 410

ELEVATE THE SUBSTRATE FROM THE HEATED PEDESTAL USING LIFT PINS — 420

MOVE THE SUBSTRATE TO A CLOSE PROXIMITY FROM THE COOLED SHOWERHEAD WHILE OPTIONALLY INCREASING GAS FLOW THRU THE COOLED SHOWERHEAD AND/OR PRESSURE IN THE VACUUM CHAMBER — 430

COOL THE SUBSTRATE UNTIL IT IS AT MAXIMUM OF 70DEGREES CELSIUS — 440

LOWER THE WAFER FROM THE FROM THE COOLED SHOWERHEAD USING THE LIFT PINS TO ALIGN WITH A SLIT VALVE DOOR OF THE VACUUM CHAMBER FOR REMOVAL BY A ROBOT — 450

FIG. 4

CHAMBER AND METHODS OF COOLING A SUBSTRATE AFTER BAKING

CROSS-REFERENCE TO RELATED APPLICATIONS

This application claims priority to the U.S. Provisional Patent Application Ser. No. 63/264,548 filed Nov. 24, 2021 of which is incorporated herein by reference in its entirety.

BACKGROUND

Field

Embodiments of the present disclosure generally relate to methods and apparatus for processing a substrate. More specifically, the disclosure is directed towards methods and apparatus for cooling a substrate after exposure to radiation.

Description of the Related Art

Integrated circuits have evolved into complex devices that can include millions of components (e.g., transistors, capacitors and resistors) on a single chip. Photolithography is a process that may be used to form components on a chip. Generally, the process of photolithography involves several stages. Initially, a photoresist layer is formed on a substrate. A chemically amplified photoresist typically includes a resist resin and a photoacid generator. The photoacid generator, upon exposure to electromagnetic radiation in a subsequent exposure stage, alters the solubility of the photoresist in the development process. The electromagnetic radiation may be generated by any suitable source, for example, a laser, an electron beam, an ion beam, or other suitable electromagnetic radiation source. The electromagnetic radiation is also selected with any desirable wavelength, for example, 193 nm or other suitable wavelength.

In the exposure stage, a photomask or reticle is used to selectively expose certain regions of the substrate to electromagnetic radiation. Other exposure methods include maskless exposure methods or the like. Exposure to light decomposes the photo acid generator, which generates acid and results in a latent acid image in the resist resin. After exposure, the substrate is disposed on a pedestal and heated in a post-exposure bake process in a process chamber. During the post-exposure bake process, the acid generated by the photoacid generator reacts with the resist resin, changing the solubility of the resist during the subsequent development process.

During the post bake process, a photoresist layer may reach temperatures of up to 400 degrees Celsius (° C.). The temperature controlled reaction of the resist resin continues in the resist resin until a temperature of about 70° C. or less. After the post-exposure bake, the substrate is removed from the process chamber and cooled in another location to stop the reaction in the resist resin. However, moving the substrate to a remote location for cooling is long and may allow the resin to react sooner than desired.

Therefore, there is a need for improved methods for resist patterning on a substrate.

SUMMARY

A method and apparatus for performing post-exposure bake cooling operations is described herein. The method begins by post exposure baking a substrate disposed on heated substrate support in a process chamber, the process chamber having a showerhead. The heated substrate support is moved to increase a distance between the heated substrate support and a cooled plate of the showerhead. The substrate is separated from the heated substrate support using a substrate lifting device. The substrate is moved into a close proximity to the cooled showerhead. The substrate is cooled until the substrate is less than about 70 degrees Celsius. The substrate is spaced away from the cooled showerhead using the substrate lifting device and aligning the substrate with a substrate transfer passage of the processing chamber for removal by a robot.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

FIG. 4 is a flow diagram of one example of the cooling operation of the method depicted in FIG. 2 utilizing the pedestal and substrate positions illustrated in FIGS. 3A to 3D.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure is generally directed towards apparatus and methods for use during post-exposure bake of a semiconductor substrate. Methods and apparatus disclosed herein assist in improving exposure resolution in a photolithography process for semiconductor processing applications by reducing the time needed to cool the substrate. The apparatus described herein enable in-situ rapid cooling of the substrate after an electric field guided bake of the resist layer on the substrate. The method and apparatus enables the rapid (typically in less than 30 seconds) cooling of a substrate from temperatures of up to about 400 degrees Celsius (° C.) to temperatures at or below about 70° C.

A "substrate" or "substrate surface," as described herein, generally refers to any substrate surface upon which processing is performed. Processing includes deposition, etching, patterning and other methods utilized during semiconductor processing. A substrate or substrate surface which may be processed also includes dielectric materials such as silicon dioxide, silicon nitride, organosilicates, and carbon doped silicon oxide or nitride materials. In certain embodiments, the substrate or substrate surface includes photoresist materials, hardmask materials, or other films or layers utilized in the patterning of a substrate. The substrate itself is not limited to any particular size or shape. Although the embodiments described herein are made with generally made with reference to a round 200 mm or 300 mm substrate, other shapes, such as polygonal, squared, rectangular, curved, or otherwise non-circular substrates may be utilized according to the embodiments described herein.

Figure 1:
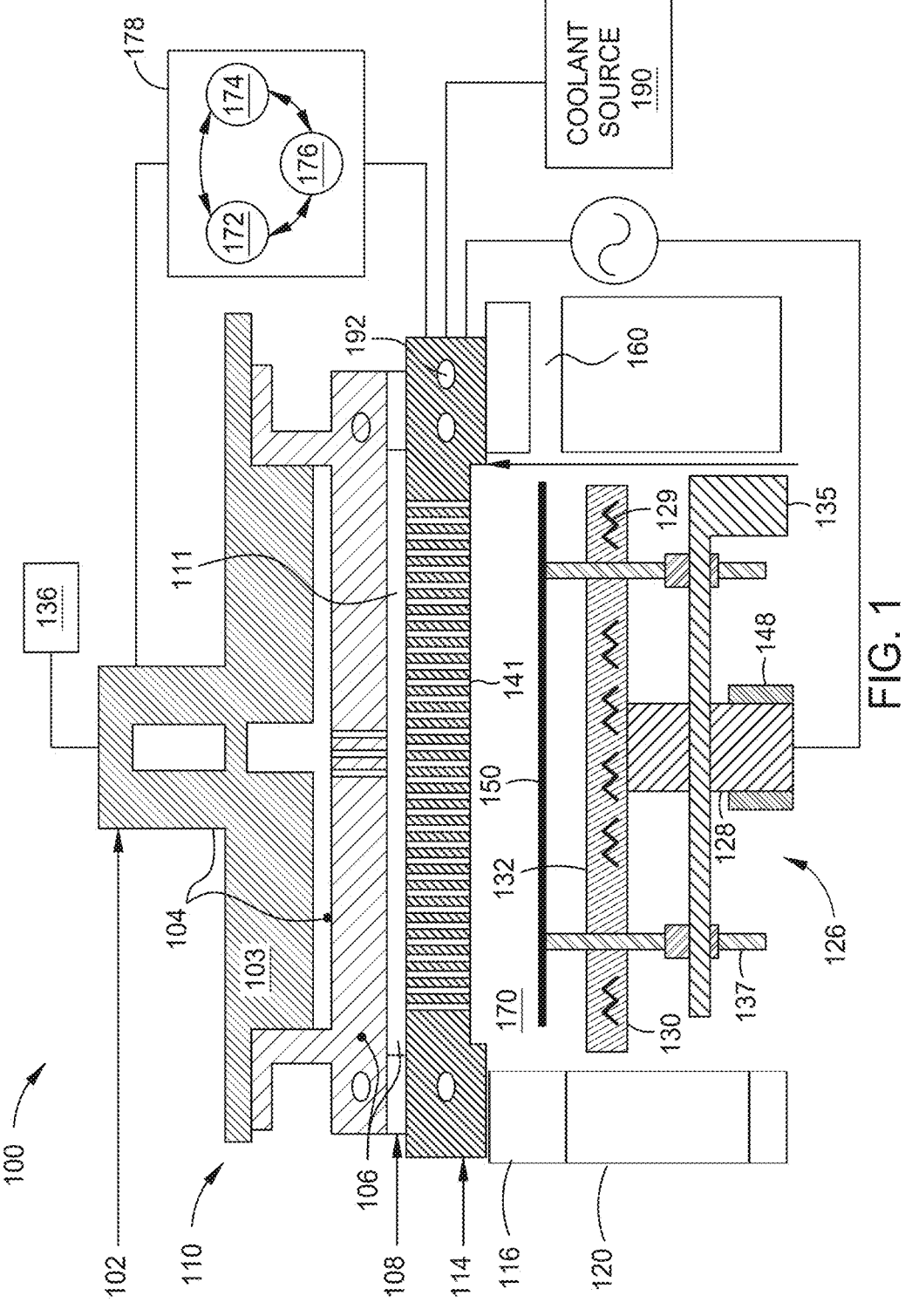
FIG. 1 illustrates a schematic cross-sectional view of a processing chamber, according to one embodiment.

FIG. 1 illustrates a schematic cross-sectional view of a process chamber 100, according to one embodiment. The process chamber 100 is configured to perform field guided post-exposure bake operations on a substrate 150 with a photoresist or chemically modified resist layer disposed thereon. However, it is contemplated that other suitably configured process chambers may benefit from the embodiments described herein.

The process chamber 100 includes an upper chamber body 116 coupled to the lower chamber body 120. The upper chamber body 116 and the lower chamber body 120 are coupled together to define at least a portion of the process volume 170. A substrate support 130 is disposed in the process volume 170 and utilized to support the substrate 150 thereon during processing. A showerhead assembly 110 is disposed on top of the upper chamber body 116 above the substrate support 130. The showerhead assembly 110 includes one or more cooled plates configured to allow process of other gas to flow therethrough. In the example of FIG. 1, the showerhead assembly 110 includes a plurality of stacked plates, one of which is cooled using temperate control techniques, such as flowing heat transfer fluid therethrough and/or via thermo-electric devices.

The lower chamber body 120 includes at least one substrate transfer passage 160 disposed therethrough. The transfer passage 160 may have a slit valve door configured to provide access to the process volume 170 by a transfer robot moving the substrate 150 into and out of the process volume 170. A pumping liner may be disposed radially inward of the lower chamber body 120. The pumping liner includes a plurality of openings connecting an exhaust plenum and the process volume 170 such that gas is removed via the exhaust plenum by a pump.

The showerhead assembly 110 includes at least one cooled plate disposed closest to the substrate support 130. The substrate 150 may be moved immediately adjacent the cooled plate to assist regulating, for example cooling, the substrate after the post bake process.

In the example depicted in FIG. 1, the showerhead assembly 110 includes a mixing block 102, a gas box 103, a gas diffuser 104, a faceplate 106, an insulator 108, and a cooled ion blocking plate 114. Each of the mixing block 102, the gas box 103, the gas diffuser 104, the faceplate 106, and the ion blocking plate 114 have a plurality of holes disposed therethrough to enable process gases to be flown through the plate stack. The ion blocking plate 114 has a bottom surface 141 facing the process volume 170. Although in the example depicted in FIG. 1 the ion blocking plate 104 is cooled and immediately adjacent the substrate support 130, in other showerheads, other types of cooled plates may be disposed closest the substrate support 130.

The mixing block 102 may serve as an RF electrode and/or a gas manifold. Process gasses are provided to the mixing block 102 from a gas source 136. The mixing block 102 may be electrically coupled to the gas diffuser 104 and the faceplate 106 that serve to redirect flow of the source gases so that gas flow is uniform. It should be noted that all of the diffusers or screens herein may be characterized as electrodes, as any such diffusers or screens may be coupled to a particular electrical potential. The insulator 108 electrically insulates the mixing block 102 and the faceplate 106 from the ion blocking plate 114.

Surfaces of the faceplate 106, the ion blocking plate 114 and the insulator 108 define a plasma generation region 111 where a first plasma is created when the gas from the gas source 136 is present and energy is provided at the faceplate 106 through the mixing block 102. The faceplate 106 and the ion blocking plate 114 may be held at different voltage potentials to control the ion density of the plasma formed therebetween. The ion blocking plate 114 filters the plasma as it passes through to reduce the concentration of ions.

Portions of the ion blocking plate 114 which are exposed directly to plasma may be coated with ceramic (e.g., alumina or yttria) while surfaces that are not exposed directly to plasma may also be coated with ceramic, and are advantageously at least coated with a passivating layer for chemical resistance to reactive gases and activated species.

The ion blocking plate 114 constitutes the bottom plate of the plate stack as described herein. The ion blocking plate 114 is a showerhead configured to prevent plasma from traveling back up the plate stack from the process volume 170. The ion blocking plate 114 is also configured to reduce the number of ions within a plasma passing through the ion blocking plate 114 and into the process volume 170. The bottom surface 141 of the ion blocking plate 114 faces a top surface 132 of the substrate support 130 disposed in the process volume 170.

The ion blocking plate 114 serves as a selectivity modulation device (SMD) which performs ion filtering. A controlled amount of radicals pass through the ion blocking plate 114 while blocking plasma from entering the processing volume 170. The ion blocking plate 114 is cooled. The ion blocking plate 114 has integrated channels 192 connected with a source of coolant 190. The integrated channels 192 may spiral through ion blocking plate 114. The source of coolant 190 can provide deionized water, glycol, an inert, high-performance, fluorinated heat transfer fluid, or other fluid suitable as a coolant. Alternately, or additionally, the ion blocking plate 114 may have thermo-electric cooling devices, such as a Peltier cooling elements and the like. The thermo-electric cooling devices may be electrically driven to provide cooling (or even heating) to the ion blocking plate 114.

The cooling of the ion blocking plate 114 (or other cooled plate of the showerhead assembly 110 closest the substrate support 130) control ions recombination efficiency by keeping the ion blocking plate 114 at a constant temperature. The plasma in the plasma cavity above the ion blocking plate 114 causes the temperature of the ion blocking plate 114 to increase. This increase in temperature causes variation in recombination efficiency. Temperature control of the ion blocking plate 114 substantially eliminates the variation.

While being exposed to the low ion density plasma, the substrate 150 sits on the substrate support 130 portion of a substrate support assembly 126. The substrate support 130 is a heated pedestal configured to control a temperature of the substrate. The substrate support assembly 126 further includes a shaft 128 and bellows connecting the substrate support assembly 126 to the lower chamber body 120. The bellows form a seal between the process volume 170 and an outside environment. One or more backside gas sources may be coupled to the substrate support assembly 126 to supply backside gas to the top surface 132 of the substrate support 130.

A power source and motion apparatus are also coupled to the substrate support assembly 126. The power source may be an AC or a DC power source. The power source is configured to supply power to the motion apparatus 148 and/or heating devices 129 within the substrate support 130.

The motion apparatus 148 is configured to enable movement of the substrate support assembly 126, such as raising or lowering the substrate support assembly 126, rotating the substrate support assembly about a central axis, or tilting the substrate support 130.

The substrate support assembly 126 additionally has a substrate lifting device 137. The substrate lifting device 137 is coupled to a movement assembly 135 for raising and lowering the substrate lifting device 137. The substrate lifting device 137 is raised to an upper position for accepting the substrate 150 from the transfer robot. The substrate lifting device 137 is lowered to place the substrate 150 onto the top surface 132 of the substrate support 130 for processing. The substrate lifting device 137 may be lift pins, a hoop, edge support ring, or any suitable device for accepting the substrate 150 from a robot blade and moving the substrate from the top surface 132 of the substrate support 130 to a raised position above the substrate support 130. In one example, the substrate lifting device 137 is a plurality of lift pins. The lift pins can move to an elevated position to pick the substrate 150 and balance the substrate 150 thereon the pins. The lift pins can move below top surface 132 of the substrate support 130 into lift pin holes while the substrate 150 is engaged with the heated substrate support 130 during processing. In another example, the substrate lifting device 137 is a hoop having openings for the robot blade. The hoop can move to an elevated position to pick the substrate 150 and hold the substrate 150 along its edge. The hoop can move into a groove in the top surface 132 of the substrate support 130 while the substrate 150 is engaged with the heated substrate support 130 during processing.

The above-described processing chamber 100 can be controlled by a processor based system controller such a controller 178. For example, the controller 178 may be configured to control flow of various precursor gases via the gas sources 136 and coordinate plasma generation and flows within the processing chamber 100. The controller 178 may also be configured to control all aspects of electric field generation within the processing chamber 100 by modulating and controlling application of voltages to one or more of the components of the showerhead assembly 110 and the substrate support assembly 126 to generate an electric field within the process volume 170. The controller 178 further operates to control various stages of a substrate process sequence.

The controller 178 includes a programmable central processing unit (CPU) 172 that is operable with a memory 174 and a mass storage device, an input control unit, and a display unit (not shown), such as power supplies, clocks, cache, input/output (I/O) circuits, and the like, coupled to the various components of the processing chamber 100 to facilitate control of the substrate processing. The controller 178 also includes hardware for monitoring substrate processing through sensors in the processing chamber 100, including sensors monitoring flow, RF power, voltage potential and the like. Other sensors that measure system parameters such as substrate temperature, chamber atmosphere pressure and the like, may also provide information to the controller 178.

To facilitate control of the processing chamber 100 and associated plasma and electric field formation processes, the CPU 172 may be one of any form of general purpose computer processor that can be used in an industrial setting, such as a programmable logic controller (PLC), for controlling various chambers and sub-processors. The memory 174 is coupled to the CPU 172 and the memory 174 is non-transitory and may be one or more of readily available memory such as random access memory (RAM), read only memory (ROM), floppy disk drive, hard disk, or any other form of digital storage, local or remote. Support circuits 176 are coupled to the CPU 172 for supporting the processor in a conventional manner. The plasma and electric field formation and other processes are generally stored in the memory 174, typically as a software routine. The software routine may also be stored and/or executed by a second CPU (not shown) that is remotely located from the hardware being controlled by the CPU 172.

The memory 174 is in the form of computer-readable storage media that contains instructions, that when executed by the CPU 172, facilitates the operation of the processing chamber 100. The instructions in the memory 174 are in the form of a program product such as a program that implements the method of the present disclosure. The program code may conform to any one of a number of different programming languages. In one example, the disclosure may be implemented as a program product stored on computer-readable storage media for use with a computer system. The program(s) of the program product define functions of the embodiments (including the methods described herein).

In certain embodiments, the program(s) embody machine learning capabilities. Various data features include process parameters such as processing times, temperatures, pressures, voltages, polarities, powers, gas species, precursor flow rates, and the like. Relationships between the features are identified and defined to enable analysis by a machine learning algorithm to ingest data and adapt processes being performed by the processing chamber 100. The machine learning algorithms may employ supervised learning or unsupervised learning techniques. Examples of machine learning algorithms embodied by the program include, but are not limited to, linear regression, logistic regression, decision tree, state vector machine, neural network, naïve Bayes, k-nearest neighbors, K-Means, random forest, dimensionality reduction algorithms, and gradient boosting algorithms, among others. In one example, the machine learning algorithm is utilized to modulate RF power and precursor gas flow to form a plasma and then facilitate maintenance of a low ion density plasma which includes a greater concentration of radicals than ions. The formation of charges species in this manner may be refined and improved by identifying constituents of the charged species cloud (e.g. radicals and/or ions) and modifying chamber process or apparatus characteristics to form and maintain a charged species cloud which exhibits desirable characteristics as an electric field coupling medium between the ion blocking plate 114 and the substrate support 130.

Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure.

Figure 2:
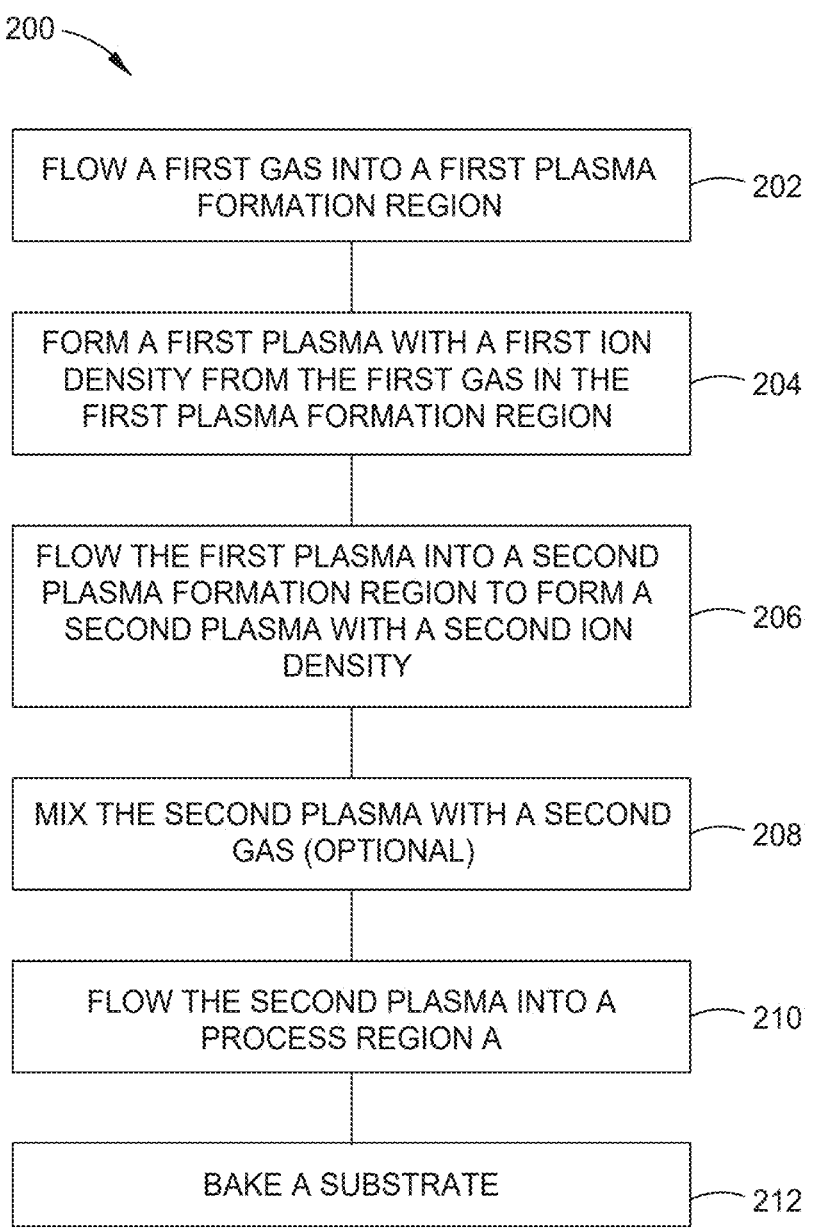
FIG. 2 is a flow diagram of a method of processing a substrate within the processing chamber of FIG. 1.

FIG. 2 is a flow diagram of a method 200 of processing a substrate within the processing chamber of FIG. 1, according to one embodiment. The substrate 150 is introduced into the processing volume 170 of the processing chamber 100 on the robot blade. The cooled ion blocking plate 114 (or other cooled plate of the showerhead assembly 110 closest the substrate support 130) helps the substrate 150 to not overheat when the substrate 150 is coming into the processing chamber 100 and still sitting on the robot blade. This is important advantage to reduce or eliminate completely field on delay, i.e., when the substrate 150 is engaging with the substrate support 130, the AC or DC or both fields is applied when the substrate 150 reaches the desirable temperature but still below the baking temperature. The method 200 includes flowing a first gas into a first plasma formation region, such as the plasma generation region 111, during an operation 202. After flowing the first gas into the first plasma formation region, a first plasma is formed within the plasma generation region 111 during another operation 204. The plasma has a first ion density. The first ion density plasma is a high ion density plasma, such that the ion density within the first plasma is about $10^5$ ions/cm³ to about $10^{10}$ ions/cm³.

During operation 206, the ions within the first plasma are reduced by the ion blocking plate 114 to form the second plasma. The second plasma may optionally be mixed with a second gas during another operation. During the operation 208, the second gas is mixed with the second plasma. The second plasma has a second ion density lower than the first ion density of the first plasma. The second plasma is described as a low ion density plasma and has an ion concentration of about $10^3$ ions/cm³ to about $10^7$ ions/cm³. As the second plasma passes through the ion blocking plate 114 at operation 210, ions are removed to leave a greater ratio of radicals to ions within the second plasma. The second plasma is heated to a temperature between about 120° C. to about 250° C.

At operation 210, the second plasma is flowed through the apertures of the ion blocking plate 114 and into the process volume 170 between ion blocking plate 114 and the substrate support 130/substrate 150. The voltage differential between the ion blocking plate 114 and the substrate support 130 is about 0 V to about 200 V, such as about 10 V to about 150 V. The voltage source 260 may further include AC/DC waveform control, such that a DC voltage may be applied or an AC voltage with a frequency of less than or equal to about 7.5 kHz, such as an AC voltage of about 0 kHz to about 7.5 kHz. In some embodiments, the AC waveform may have a DC offset, such that the signal peaks are not centered about 0 V. The pressure within the process volume 170 is about 0.5 Torr to about 10 Torr, such as about 0.5 Torr to about 8 Torr, such as about 1 Torr to about 5 Torr.

The second plasma is a charged species cloud while within the process volume 170, such that the concentration of ions within the second plasma is reduced while passing through the ion blocking plate 114 and into the process volume 170. The radicals within the charged species cloud are controlled by the electric field formed between the ion blocking plate 114 and the substrate support 130. The electric field assists in controlling the ion density within the second plasma, such that the ion or electron density is about $10^4$ ions/cm³ to about $10^6$ ions/cm³. The charged ions within the charges species cloud have an average kinetic energy of less than about 1 eV each and therefore have reduced impact on the photoresist disposed on the substrate 150 while also forming a dark plasma above the substrate support 130. The dark plasma is beneficial in that the photoresist is does not undergo a concurrent exposure process during the post exposure bake operation. Either concurrently with or immediately after the second plasma is flowed into the process volume 170 to form the charged species cloud, the substrate on the top surface 132 is baked at a temperature of about 75° C. to about 400° C., such as about 100° C. to about 250° C. during operation 212.

After baking at operation 212, the substrate 150 is rapidly cooled to temperatures below about 70° C. to slow or mitigate the continued baking from negatively impacting the photoresist. For example, the substrate 150 may be cooled to a temperature below about 70° C. In another example, the substrate 150 is cooled to a temperature below about 70° C. in 30 seconds or less. By performing cooling in-situ the process chamber, cooling can be performed much faster as compared to conventional processes where the substrate 150 transported by a robot to a cooling location outside of the process chamber 100. Rapidly cooling the substrate 150 is enhanced by removing the substrate from the heated substrate support 130 while remaining in the process chamber 100. A method and apparatus for rapidly cooling the substrate 150 is disclosed below with respect to FIGS. 3A-3D and FIG. 4.

FIGS. 3A to 3D illustrate various pedestal and substrate positions suitable for cooling the substrate in the processing chamber during the cooling operation 212 of the method 200 illustrated in FIG. 2. FIG. 4 is a flow diagram of one example of the cooling operation 212, which can also alternatively be used with other processes in addition to the method 200 described above where in-situ substrate cooling is desirable. The cooling operation 212 in FIG. 4 is described with reference to the pedestal and substrate positions illustrated in FIGS. 3A to 3D.

Figure 3A:
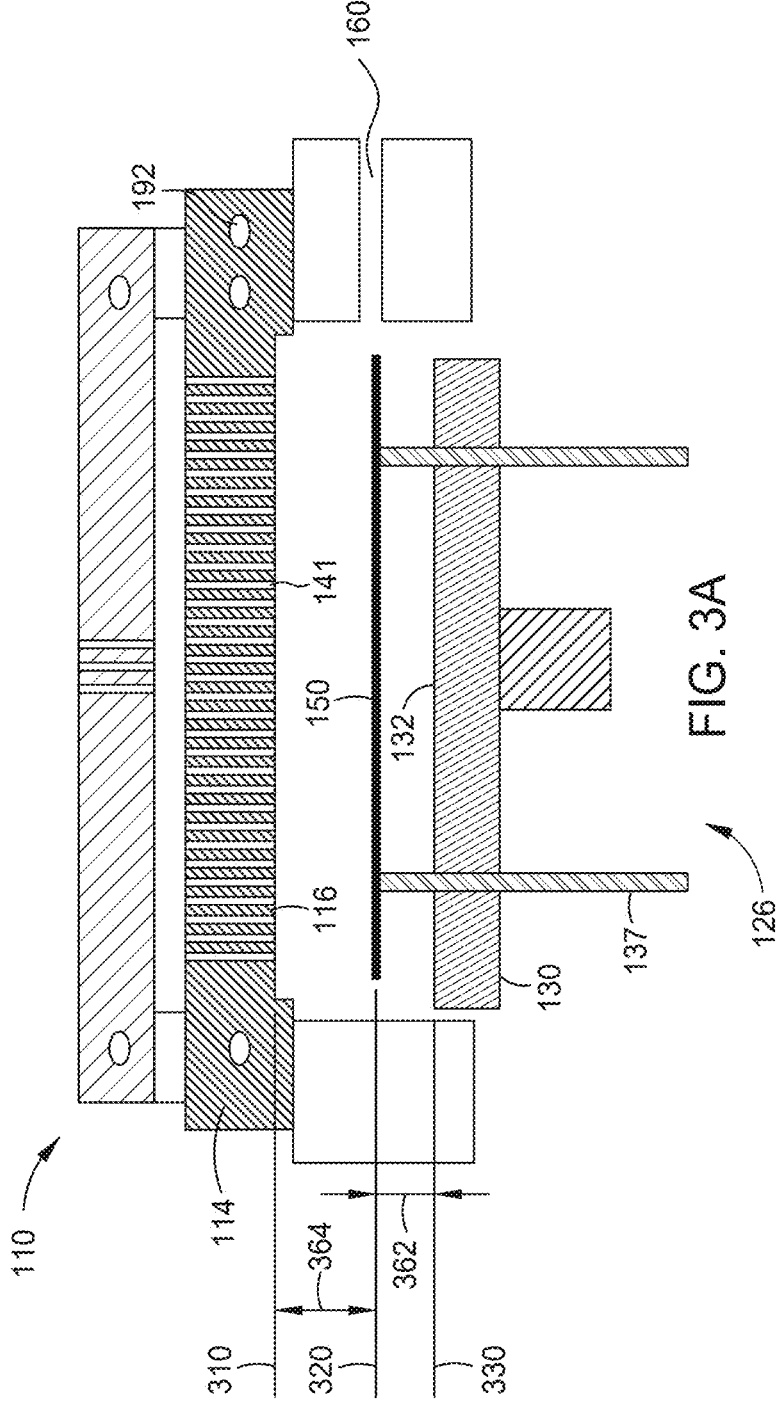
FIGS. 3A to 3D illustrate various pedestal and substrate positions suitable for use during a cooling operation of the method depicted in FIG. 2.

FIG. 3A illustrates the substrate support 130 in a down position (shown by imaginary reference line 330) and the substrate lifting device 137 in a load/unloading position (shown by imaginary reference line 320). The load/unloading position of the substrate lifting device 137 is aligned with the transfer passage 160 to allow a robot, not shown, to pick and place the substrate on the substrate lifting device 137 through the transfer passage 160. The substrate 150, while on the substrate lifting device 137, is elevated a first distance 362 above the top surface 132 of the substrate support 130 by the substrate lifting device 137.

FIG. 3A also the substrate 150 elevated a first distance 362 above the top surface 132 of the substrate support 130 by the substrate lifting device 137. The substrate 150 is disposed below the bottom surface 141 (shown by imaginary reference line 310) of the ion blocking plate 114 (or other cool plate of the showerhead stack disposed closest the substrate support 130) by a second distance 364.

Figure 3B:
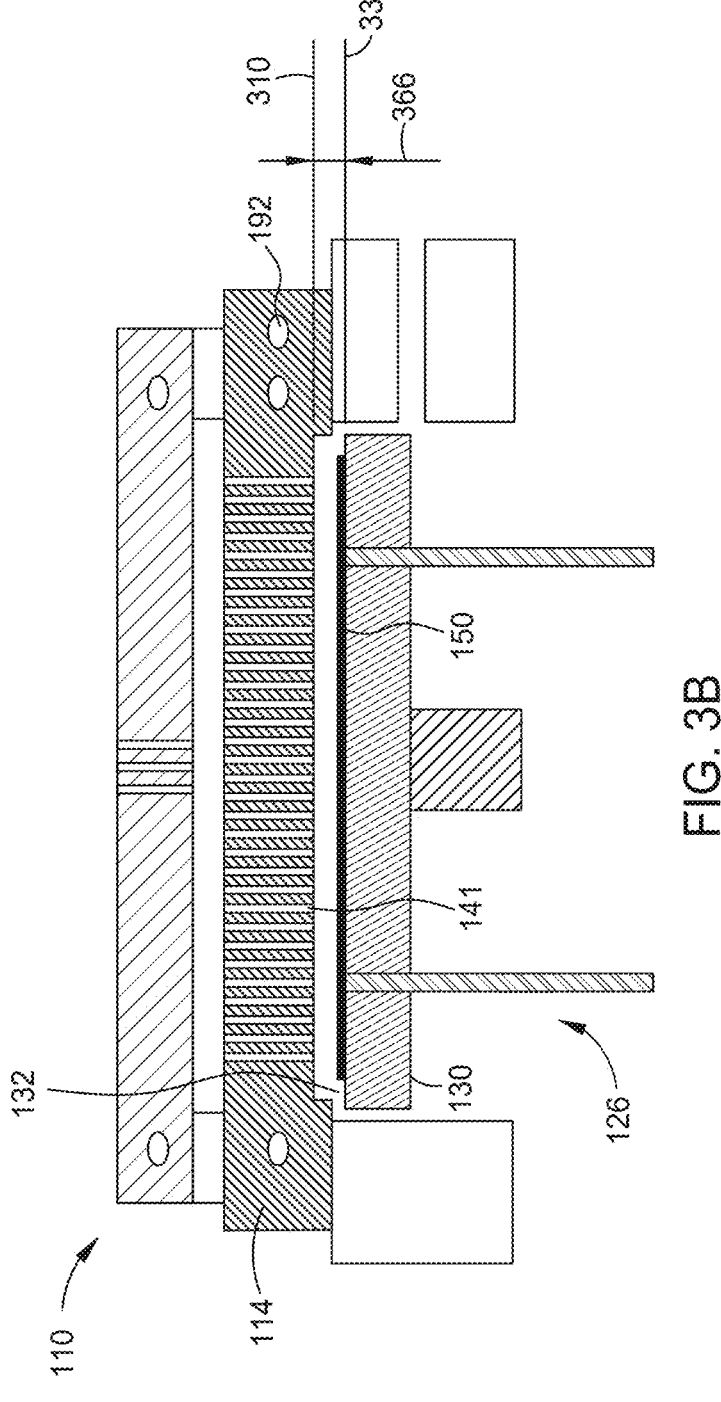

FIG. 3B illustrates the substrate support 130 in an up position, i.e., a processing position (as shown by imaginary reference line 332), and the substrate lifting device 137 is in a retracted position such that the substrate 150 is resting on the top surface 132 of the substrate support 130. The substrate 150 is in close proximity to the ion blocking plate 114 in a position for baking. A third distance 366 between the bottom surface 141 of the ion blocking plate 114 and the top surface 132 of the substrate support 130 is about 2 mm to about 20 mm, such as about 5 mm to about 15 mm, such as about 10 mm to about 15 mm.

Figure 3C:
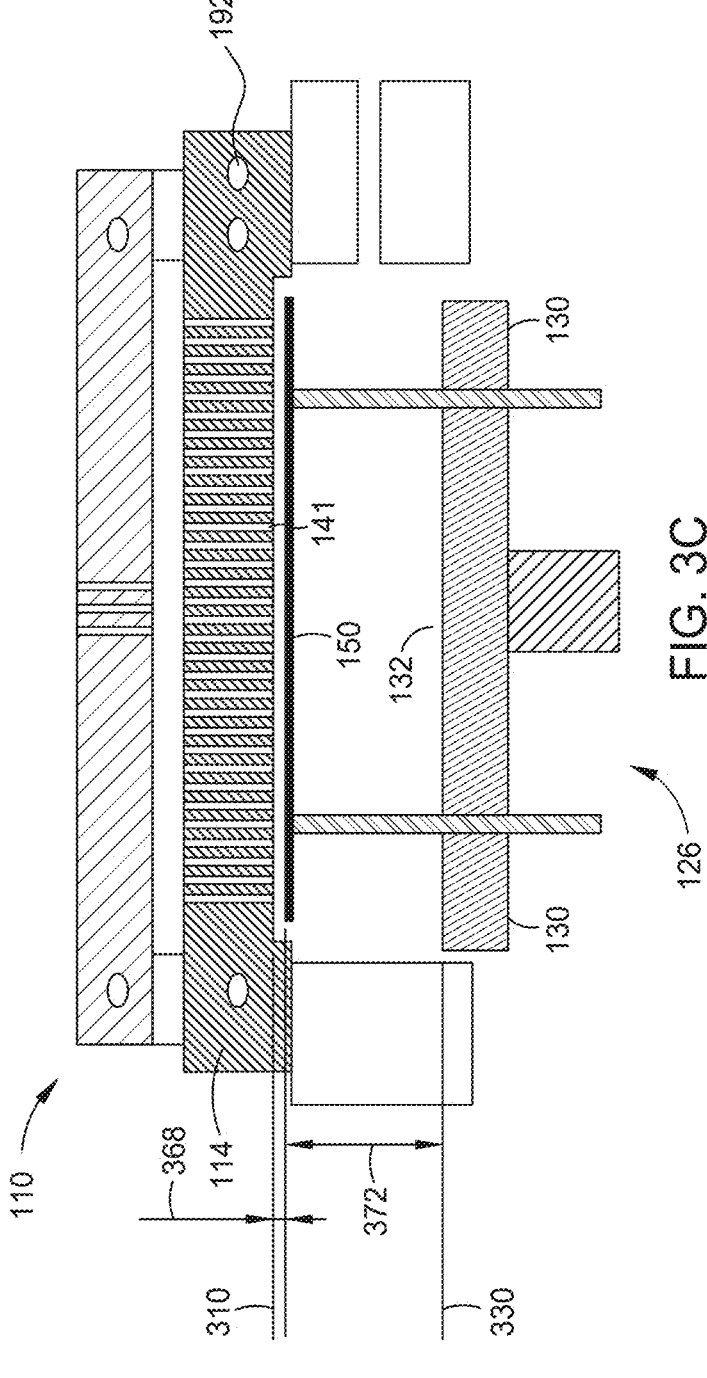

FIG. 3C illustrates the substrate support 130 in the down position (as shown by imaginary reference line 330) and the substrate lifting device 137 is in a post bake cooling position, i.e., nearest the bottom surface 141 of the ion blocking plate 114. The substrate 150 is elevated a fourth distance 372 above the top surface 132 of the substrate support 130 by the substrate lifting device 137. The substrate 150 is a fourth distance 368 from the bottom surface 141 of the ion blocking plate 114. The fourth distance 368 is suitable for cooling the substrate with the cooling mechanisms provided by the ion blocking plate 114 (or other cooled plate of the showerhead assembly 110 closest the substrate support 130). In one example, the fourth distance 368 of the substrate 150 from the ion blocking plate 114 is about 2 mm or less, such as about 1 mm.

Figure 3D:
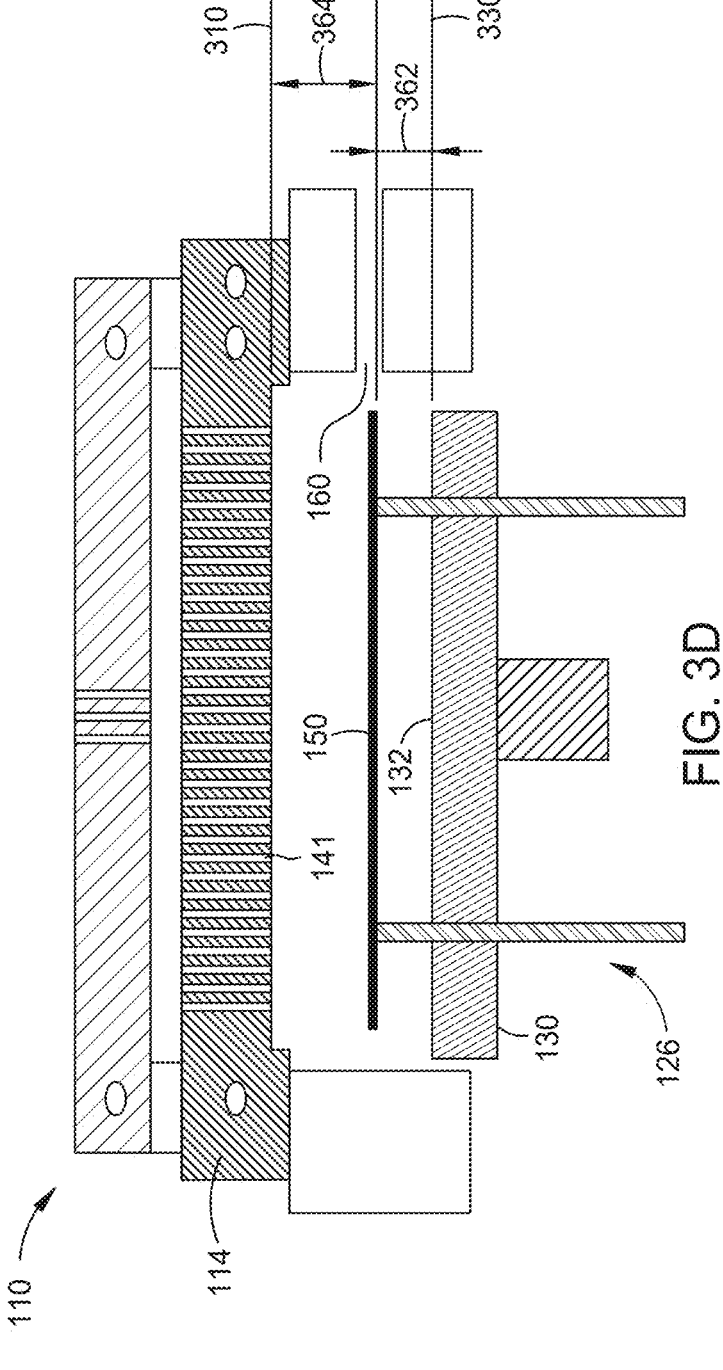

FIG. 3D illustrates the substrate support 130 back in the down position 330 with the substrate lifting device 137 in the load/unloading position 320 for moving the substrate 150 out the transfer passage 160 with the robot.

The cooling operation 212 depicted in flow diagram of FIG. 4 begins after the completion of operation 210 of method 200 or other method of baking the substrate (or generally when the substrate needs in-situ cooling before, during or after another process performed in the process chamber 100 or other chamber). Prior to operation 202 of the method 200, the substrate support 130 is in the down position shown by reference line 330 and the substrate lifting device 137 is in the load/unloading position shown by reference line 320, as depicted in FIG. 3A. During operations 202-210 of method 200, the substrate support 130 is in the processing position shown by reference line 332 with the substrate lifting device 137 retracted such that the substrate 150 is resting on the top surface 132 of the substrate support 130, as depicted in FIG. 3B. After completion of operation 210, the substrate 150 is cooled at operation 212.

At operation 212, the heated substrate support 130 is moved to increase the gap between the heated substrate support and the cooled ion blocking plate 114 (or other cooled plate of the showerhead assembly 110 closest the substrate support 130). The heated substrate support 130, as consequently the substrate 150 disposed thereon, may be at a temperature above 70° C., such as up to about 400° C. The substrate 150 is at a temperature above 70° C. during the baking operation 210 to assist the chemical reaction that occurs during the exposure.

At operation 420, the heated substrate support 130 is spaced from the substrate 150. In one example, the substrate lifting device 137 is extended relative to the heated substrate support 130 to space the substrate 150 away from the heated substrate support 130. Spacing the substrate may, in some examples, move the substrate 150 toward the cooled lowest plate of the showerhead stack, in this case the ion blocking plate 114. In this manner, heat transfer to the substrate 150 from the substrate support 130 is significantly reduced.

At operation 430, the substrate 150 is moved into close proximity the cooled showerhead, while optionally increasing gas flow through the cooled ion blocking plate 114. In one example, the substrate 150 is moved to within less than about 2 mm from the cooled showerhead. The substrate 150 is closer to the ion blocking plate 114 for the cooling operation than the baking operation. In one example, the substrate is 5 times closer to the ion blocking plate 114 during the cooling operation than during the baking operation. The temperature of the cooled ion blocking plate 114 may be controlled by cooling fluid and/or thermo-electric devices for cooling the substrate 150. Additionally, gas or even a cooled gas, may be flowed through the showerhead assembly 110 for assisting the cooling the substrate 150. The pressure and or flow of the gas may be regulated to effect faster cooling of the substrate 150 in the processing chamber 100. In one example, the gas utilized to cool the substrate is different than the gas or gas mixture provided during baking. In one example, the gas utilized to cool the substrate is hydrogen, nitrogen, argon, helium or an inert gas, which can be introduced under pressure through the cooled ion blocking plate 114 to assist cooling the substrate 150.

At operation 440, the substrate 150 is cooled to a temperature below about 70° C., such as between about 50° C. and about 70° C. The substrate 150 is cooled by the cooled ion blocking plate 114 while being elevated away from the heated substrate support 130, which reduces the time needed to cool the substrate 150 from the baking temperatures at operation 210 to a temperature less than about 70° C. The combination of spacing and proximity to the cooled plate, along with the present of a cooling gas speeds up cooling of the substrate 150 compared to conventional techniques. In one embodiment, the substrate is cooled to about 40° C. in about 20 seconds. The substrate 150 may monitored by a temperature sensor or by recipe for completing this operation.

At operation 450, the substrate 150 is moved away from the cooled showerhead using the substrate lifting device 137 to the load/unloading position 320 depicted in FIG. 3A which aligns with the transfer passage 160 of the processing chamber 100 for removal by the transfer robot.

Described herein are apparatus and methods for forming a low ion density plasma above a substrate within a process volume for baking a substrate and in-situ rapid cooling of the substrate for stopping the baking process. Advantageously, the baking process can be quickly stopped to ensure film integrity. Additionally, the apparatus and method eliminates concern about substrate transfer time and the need for a cooling pedestal disposed outside of the process chamber.

While the foregoing is directed to embodiments of the present disclosure, other and further embodiments of the disclosure may be devised without departing from the basic scope thereof, and the scope thereof is determined by the claims that follow.

What is claimed is:

1. A method for post exposure baking in a processing chamber, the method comprising:
    post exposure baking a substrate disposed on heated substrate support in a process chamber, the process chamber having a showerhead;
    moving the heated substrate support to increase a distance between the heated substrate support and a cooled plate of the showerhead;
    separating the substrate from the heated substrate support using a substrate lifting device;
    moving the substrate to a close proximity to the cooled showerhead;
    cooling the substrate until the substrate is less than about 70 degrees Celsius; and
    spacing the substrate away from the cooled showerhead using the substrate lifting device and aligning the substrate with a substrate transfer passage of the processing chamber for removal by a robot.

2. The method of claim 1, wherein moving the substrate to a close proximity to the cooled showerhead comprises:
    moving the substrate to within 2 mm of the cooled showerhead.

3. The method of claim 2, wherein cooling the substrate further comprises:
    flowing gas through the cooled showerhead while cooling the substrate in the processing chamber.

4. The method of claim 3 wherein the gas is different than a gas used during the post exposure baking of the substrate.

5. The method of claim 1, wherein post exposure baking further comprises:
    flowing a first gas into a first plasma formation region in the cooled showerhead;
    forming a first plasma with a first ion density from the first gas in the first plasma formation region;

flowing the first plasma through an ion blocking plate to form a second ion density less than the first ion density; and flowing the second ion density into a process region above the heated substrate support during baking of the substrate.

6. The method of claim 5 wherein the substrate is closer to the cooled showerhead for the in-situ cooling than the baking operation.

7. The method of claim 1 wherein the cooled showerhead comprises:

a cooled ion blocking plate having a bottom surface directly exposed to the substrate, wherein the cooled ion blocking plate is temperature controlled by cooling fluid and/or thermo-electric devices.

8. A non-transitory computer-readable medium including instructions that, when executed by a processing unit of a computer system having a device driver capable of simultaneously supporting a plurality of devices, causes the processing unit to perform in-situ cooling of a substrate after post exposure baking in a processing chamber, by performing steps of:

post exposure baking a substrate disposed on heated substrate support in a process chamber, the process chamber having a showerhead;

moving the heated substrate support to increase a distance between the heated substrate support and a cooled plate of the showerhead;

separating the substrate from the heated substrate support using a substrate lifting device;

moving the substrate to a close proximity to the cooled showerhead;

cooling the substrate until the substrate is less than about 70 degrees Celsius; and spacing the substrate away from the cooled showerhead using the substrate lifting device and aligning the substrate with a substrate transfer passage of the processing chamber for removal by a robot.

9. The non-transitory computer-readable medium of claim 8 wherein moving the substrate to a close proximity to the cooled showerhead comprises:

moving the substrate to within 2 mm of the cooled showerhead.

10. The non-transitory computer-readable medium of claim 9 further comprising:

flowing gas thru the cooled showerhead onto the substrate in the processing chamber.

11. The non-transitory computer-readable medium of claim 10 wherein the gas is helium.

12. The non-transitory computer-readable medium of claim 8 further comprising a baking operation, wherein the baking operation comprises:

flowing a first gas into a first plasma formation region in the cooled showerhead;

forming a first plasma with a first ion density from the first gas in the first plasma formation region;

flowing the first plasma through an ion blocking plate to form a second ion density less than the first ion density; and flowing the second ion density into a process region above the heated substrate support during baking of the substrate.

13. The non-transitory computer-readable medium of claim 12 wherein the substrate is closer to the cooled showerhead for the in-situ cooling than the baking operation.

14. The non-transitory computer-readable medium of claim 8 wherein the cooled showerhead comprises:

a cooled ion blocking plate having a bottom surface directly exposed to the substrate, wherein the cooled ion blocking plate is temperature controlled by cooling fluid and/or Peltier devices.

15. A system, comprising:

a processor; and a memory having instructions stored thereon, which, when executed by the processor, performs an operation for in-situ cooling of a substrate after post exposure baking in a processing chamber, the operation comprising:

post exposure baking a substrate disposed on heated substrate support in a process chamber, the process chamber having a showerhead;

moving the heated substrate support to increase a distance between the heated substrate support and a cooled plate of the showerhead;

separating the substrate from the heated substrate support using a substrate lifting device;

moving the substrate to a close proximity to the cooled showerhead;

cooling the substrate until the substrate is less than about 70 degrees Celsius; and spacing the substrate away from the cooled showerhead using the substrate lifting device and aligning the substrate with a substrate transfer passage of the processing chamber for removal by a robot.

16. The system of claim 15 wherein moving the substrate to a close proximity to the cooled showerhead comprises:

moving the substrate to within 2 mm of the cooled showerhead.

17. The system of claim 16 further comprising:

flowing gas thru the cooled showerhead onto the substrate in the processing chamber.

18. The system of claim 17 wherein the gas is helium.

19. The system of claim 15 further comprising a baking operation, wherein the baking operation comprises:

flowing a first gas into a first plasma formation region in the cooled showerhead;

forming a first plasma with a first ion density from the first gas in the first plasma formation region;

flowing the first plasma through an ion blocking plate to form a second ion density less than the first ion density; and flowing the second ion density into a process region above the heated substrate support during baking of the substrate, wherein the substrate is closer to the cooled showerhead for the in-situ cooling than the baking operation.

20. The system of claim 15 wherein the cooled showerhead comprises:

a cooled ion blocking plate having a bottom surface directly exposed to the substrate, wherein the cooled ion blocking plate is temperature controlled by cooling fluid and/or Peltier devices.

*     *     *     *     *